(12) United States Patent
Ahn et al.

(10) Patent No.: US 7,738,841 B2
(45) Date of Patent: Jun. 15, 2010

(54) SYSTEMS, METHODS AND APPARATUSES FOR HIGH POWER COMPLEMENTARY METAL OXIDE SEMICONDUCTOR (CMOS) ANTENNA SWITCHES USING BODY SWITCHING AND EXTERNAL COMPONENT IN MULTI-STACKING STRUCTURE

(75) Inventors: Minsik Ahn, Atlanta, GA (US); Chang-Ho Lee, Marietta, GA (US); Jaejoon Chang, Duluth, GA (US); Wangmyong Woo, Cumming, GA (US); Haksun Kim, Daejeon (KR); Joy Laskar, Marietta, GA (US)

(73) Assignees: Samsung Electro-Mechanics (KR); Georgia Tech Research Corporation, Atlanta, GA (US)

( * ) Notice: Subject to any disclaimer, the term of this patent is extended or adjusted under 35 U.S.C. 154(b) by 448 days.

(21) Appl. No.: 11/855,950

(22) Filed: Sep. 14, 2007

(65) Prior Publication Data

US 2009/0073078 A1    Mar. 19, 2009

(51) Int. Cl.
*H04B 1/44*    (2006.01)
(52) U.S. Cl. .................. 455/78; 455/83; 455/277.1; 455/278.1; 455/319
(58) Field of Classification Search .................. 455/78, 455/83, 277.1, 278.1, 319
See application file for complete search history.

(56) References Cited

U.S. PATENT DOCUMENTS

| | | | |
|---|---|---|---|
| 5,461,265 | A | 10/1995 | Kunihisa et al. |
| 5,818,099 | A | 10/1998 | Burgharz |
| 6,094,088 | A | 7/2000 | Yano |
| 6,396,325 | B2 | 5/2002 | Goodell |
| 6,788,957 | B1 | 9/2004 | Recouly et al. |
| 6,836,172 | B2 | 12/2004 | Okashita |

(Continued)

FOREIGN PATENT DOCUMENTS

GB    2442848 A    4/2008

(Continued)

OTHER PUBLICATIONS

Combined Search and Examination Report for GB0816744.7 mailed Jan. 12, 2009.

(Continued)

*Primary Examiner*—Sanh D Phu
(74) *Attorney, Agent, or Firm*—Sutherland Asbill & Brennan LLP

(57) ABSTRACT

Embodiments of the invention may provide for a CMOS antenna switch, which may be referred to as a CMOS SPDT switch. The CMOS antenna switch may operate at a plurality of frequencies, perhaps around 900 MHz, 1.9 GHz and 2.1 GHz according to an embodiment of the invention. The CMOS antenna switch may include both a receiver switch and a transmit switch. The receiver switch may utilize a multi-stack transistor with body substrate switching and attachment of external capacitor between drain and gate to block high power signals from the transmit path as well as to maintain low insertion loss at the receiver path. Exemplary embodiments of the CMOS antenna switch may provide for 38 dBm P 0.1 dB at multi bands (e.g., 900 MHz, 1.8 GHz, and 2.1 GHz). In addition, −60 dBc second and third harmonic performance up to 30 dBm input, may be obtained according to example embodiments of the invention.

21 Claims, 13 Drawing Sheets

U.S. PATENT DOCUMENTS

| | | | |
|---|---|---|---|
| 6,882,829 | B2 | 4/2005 | Mostov et al. |
| 7,092,677 | B1 | 8/2006 | Zhang et al. |
| 7,233,775 | B2 | 6/2008 | De Graauw |
| 7,659,770 | B2 | 2/2010 | Teraguchi |
| 2003/0090313 | A1 | 5/2003 | Burgener et al. |
| 2004/0214535 | A1 | 10/2004 | Khorram |
| 2006/0119451 | A1 | 6/2006 | Chen |
| 2006/0199563 | A1 | 9/2006 | Kelly et al. |
| 2006/0252394 | A1* | 11/2006 | Suwa et al. ............ 455/201 |
| 2007/0049237 | A1 | 3/2007 | Miura et al. |
| 2008/0079653 | A1* | 4/2008 | Ahn et al. ............ 343/904 |
| 2008/0129642 | A1* | 6/2008 | Ahn et al. ............ 343/876 |
| 2008/0247338 | A1* | 10/2008 | Kim et al. ............ 370/280 |
| 2010/0001351 | A1 | 1/2010 | Zhang et al. |

FOREIGN PATENT DOCUMENTS

| | | |
|---|---|---|
| JP | 08237166 A | 9/1996 |
| WO | 9508868 A1 | 3/1995 |

OTHER PUBLICATIONS

"A high-power CMOS switch using a novel adaptive voltage swing distribution method in multistack FETs", IEEE Trans. on Microwave Theory and Techniques, vol. 56, No. 4, pp. 849-858, Apr. 2008.

"Design and analysis for a miniature CMOS SPDT switch using body-floating technique to improve performance", IEEE Transactions on Microwave Theory and Techniques, vol. 54 No. 1, pp. 31-39, Jan. 2006.

"Single-pole double-throw CMOS switches for 900-MHz and 2.4-GHz applications on p- silicon substrates", IEEE Journal of Solid-State Circuits, vol. 39, No. 1, pp. 35-41, Jan. 2004.

United Kingdom International Search Report for GB0719303.0 dated Jan. 24, 2008.

United Kingdom International Search Report for GB0710606.5, dated Sep. 27, 2007.

Office Action dated Jan. 19, 2010 for German Patent Application No. 102008046778.2.

Karl Goser, Großintegrationstechnik - Teil 1: Vom Transistor zur Grundschaltung. Heidelberg: Hüthig, 1990, S. 99-10. ISBN: 3-7785-1615-9.

Non-Final Office Action dated Mar. 24, 2010 for Application No. 11/943,378.

Non-Final Office Action dated Jan. 26, 2010 for Application No. 11/857,322.

* cited by examiner

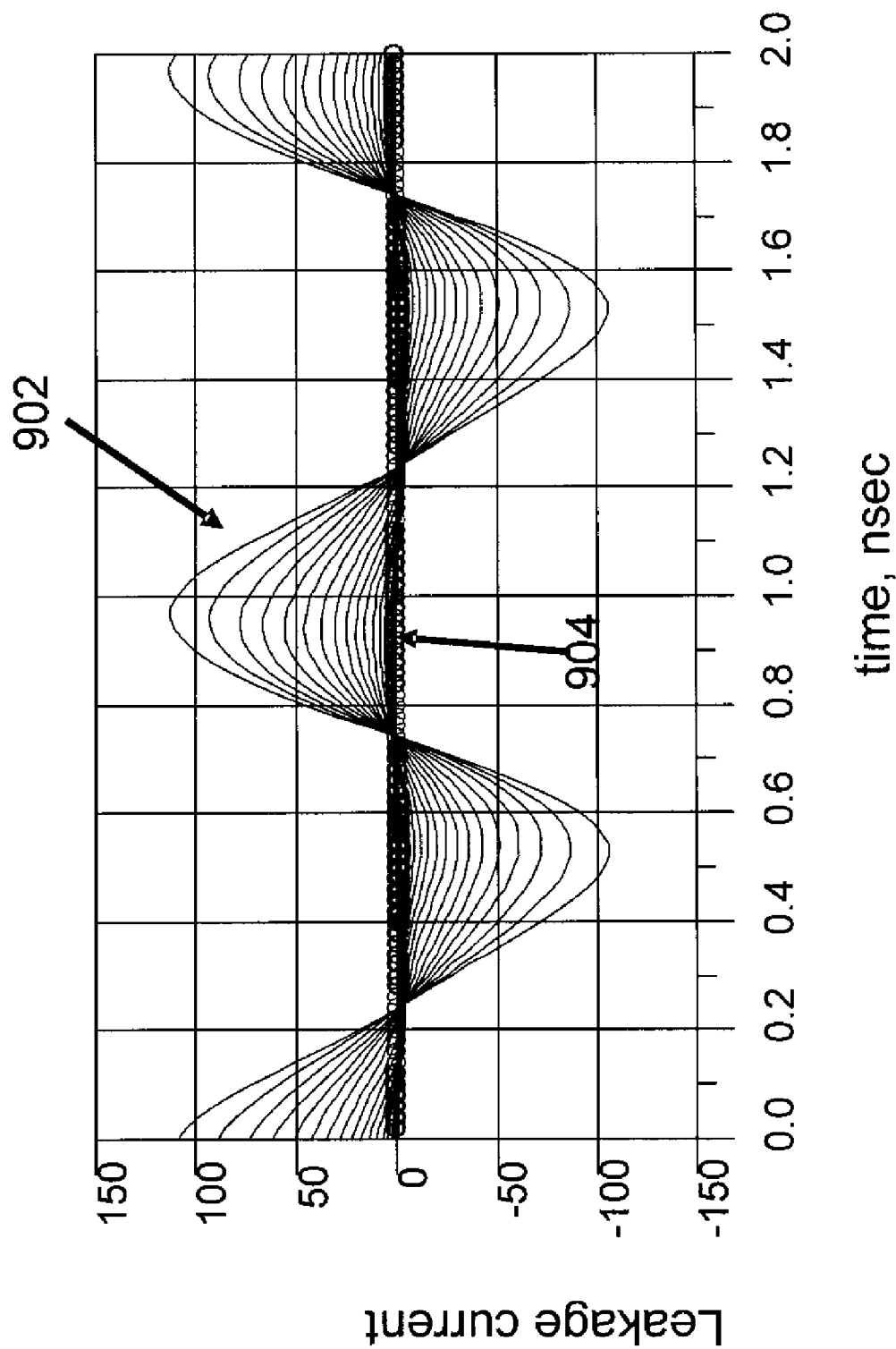

SYSTEMS, METHODS AND APPARATUSES FOR HIGH POWER COMPLEMENTARY METAL OXIDE SEMICONDUCTOR (CMOS) ANTENNA SWITCHES USING BODY SWITCHING AND EXTERNAL COMPONENT IN MULTI-STACKING STRUCTURE

FIELD OF THE INVENTION

The invention relates generally to antenna switches, and more particularly, to CMOS (complementary metal oxide semiconductor) antenna switches.

BACKGROUND OF THE INVENTION

In the past decade, the wireless communication industry has experienced explosive growth, which has in turn accelerated the development of integrated circuit (IC) industry. In particular, in the IC industry, many mobile application systems like low noise amplifiers (LNAs), mixers, and voltage-controlled oscillators (VCOs) have been integrated into CMOS technology. Two significant mobile application components—power amplifiers (PAs) and radio frequency (RF) switches—have not yet been commercially integrated into CMOS technology.

However, IC industry research is quickly moving towards power amplifier integrated into CMOS technology. For example, current research indicates that a CMOS power amplifier may be feasible and be able to provide a significant amount of power, perhaps up to 2 W, for mobile communications. Accordingly, when the power amplifier becomes integrated into CMOS technology, there will be a need for an RF switch integrated into CMOS technology.

However, current CMOS technology presents a variety of difficulties for its application to RF switches. In particular, CMOS material characteristics, including lossy substrates due to low mobility of electrons and low breakdown voltages due to p-n junction, hot carrier effects, have prevented CMOS technology from being used for RF switches that require multi-band operation, high power levels, and/or integration with other devices and circuits.

BRIEF SUMMARY OF THE INVENTION

Embodiments of the invention may provide for CMOS RF switches, which may be referred to as a CMOS SPDT switch. According to an embodiment of the invention, the CMOS RF switch may be fabricated using a standard 0.18 um process, although other processes may be utilized without departing from the embodiments of the invention. In order to provide high-power handling capability in a multi-band operation (e.g., about 900 MHz, 1.9 GHz and 2.1 GHz) of the CMOS RF switch, a multi-stacked transistor with substrate body switching may be applied to the receiver switch. According to an embodiment of the invention, the CMOS RF switch may provide higher power blocking capability and lower leakage current toward the receiver switch at the transmission (Tx) mode as well as low insertion loss at the reception (Rx) mode at multi-band (e.g., 900 MHz, 1.9 GHz and 2.1 GHz).

According to an example embodiment of the invention, there is a CMOS antenna switch. The CMOS antenna switch may include an antenna operative at a plurality of radio frequency (RF) bands, a transmit switch in communication with the antenna, and a receiver switch in communication with the antenna, where the receiver switch comprises a plurality of transistors. The CMOS antenna switch may also include a first external component provided for a first transistor of the plurality of transistors, where the first transistor includes a first source and a first gate, and wherein the first external component connects the first source and the first gate, and a second external component provided for a second transistor of the plurality of transistors, where the second transistor includes a second gate, a second drain, and a second body substrate, where the second external component connects the second gate and the second drain, and where the second body substrate is selectively connectable between a resistance and ground.

According to another example embodiment of the invention, there is a method for a CMOS antenna switch. The method may include providing an antenna operative at a plurality of radio frequency (RF) bands, electrically connecting a transmit switch and a receiver switch to the antenna, where the receiver switch comprises a plurality transistors, and providing a first external component for a first transistor of the plurality of transistors, where the first transistor includes a first source and a first gate, and wherein the first external component connects the first source and the first gate. The method may also include providing a second external component for a second transistor of the plurality of transistors, where the second transistor includes a second gate, a second drain, and a second body substrate, where the second external component connects the second gate and the second drain, and where the second body substrate is selectively connectable between a resistance and ground.

According to yet another embodiment of the invention, there is a CMOS antenna switch. The CMOS antenna switch may include an antenna operative at a plurality of radio frequency (RF) bands, a transmit switch in communication with the antenna, and a receiver switch in communication with the antenna, where the receiver switch includes a plurality of transistors, including a first transistor having a first source and a first gate, and a second transistor having a second gate, a second drain, and a second body substrate. The CMOS antenna switch may also include means for electrically connecting the first source and the first gate, means for electrically connecting the second gate and the second drain, and means for selectively connecting the second body substrate between a resistance and ground.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 9 illustrates an example of receiver switch simulation results in terms of leakage current toward receiver, according to an example embodiment of the invention.

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for CMOS RF antenna switches, which may also be referred to as SPDT CMOS switches. The CMOS RF antenna switches in accordance with embodiments of the invention may provide for one or more of multi-band operation, high power handling, and integration with other devices and circuits. Generally, the CMOS RF antenna switch may include a receiver switch and a transmit switch. The receiver switch may utilize one or more switching substrate bodies and external components such as capacitors between drain-gate and source-gate in a multi-stack structure, which will be described in further detail below. In addition, the transmit switch may utilize a substrate body tuning technique, as will also be described in further detail below.

I. A First Embodiment of CMOS RF Antenna Switch

Figure 2A:
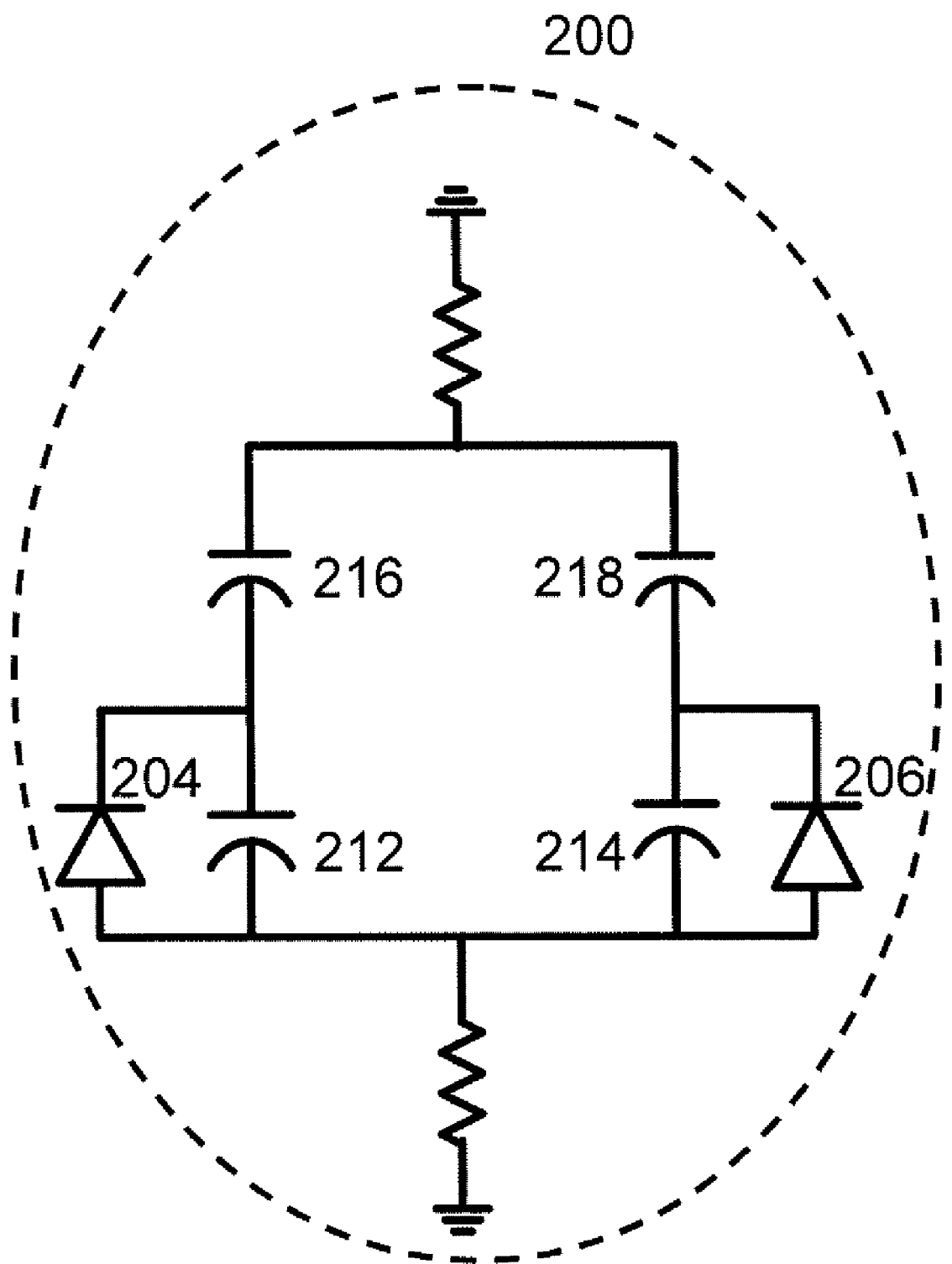
FIG. 2A illustrates an equivalent lumped model of a body floating transistor at an OFF state, according to an example embodiment of the invention.
Figure 2B:
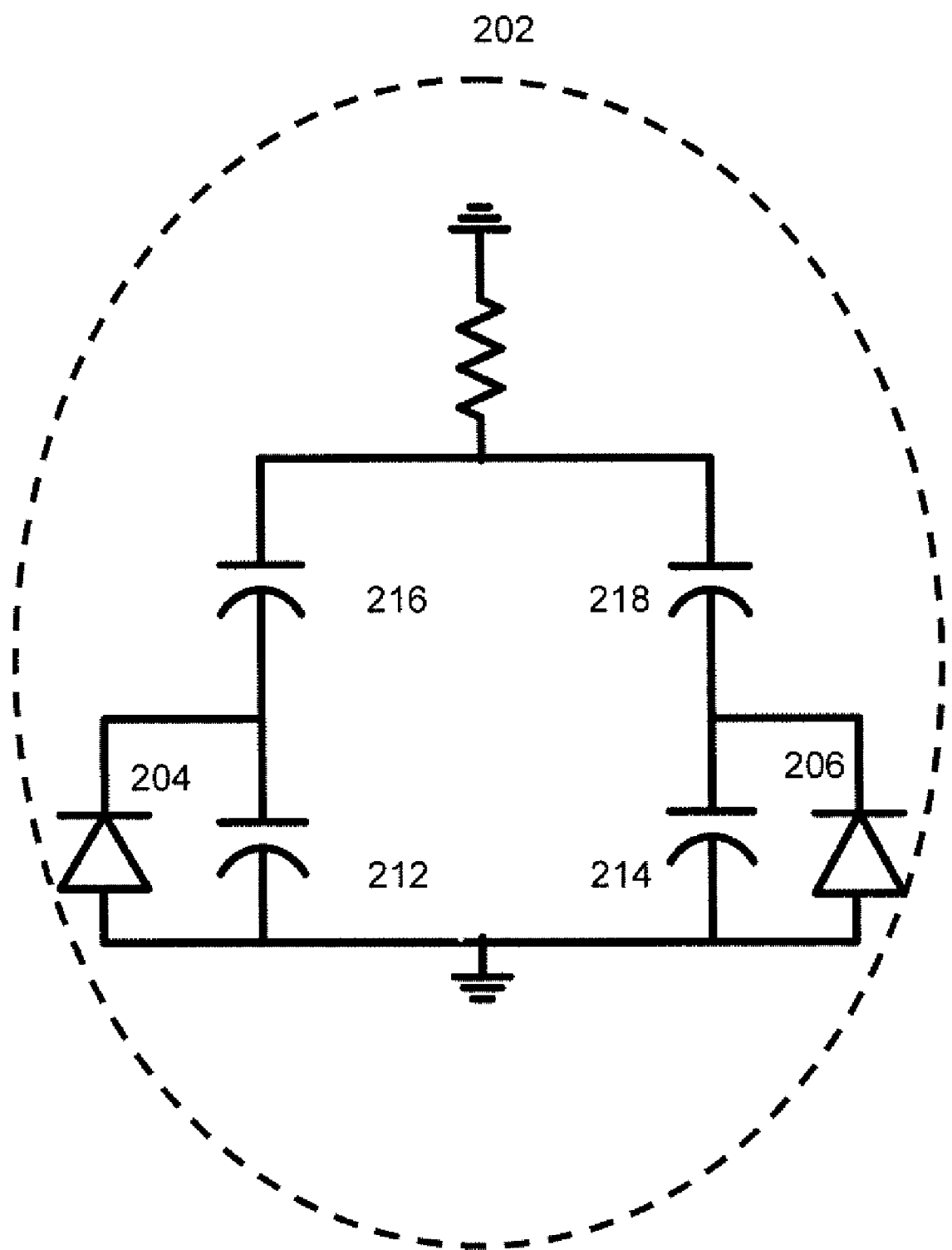
FIG. 2B illustrates an equivalent lumped model of a body grounded transistor at OFF state, according to an example embodiment of the invention.
Figure 3:
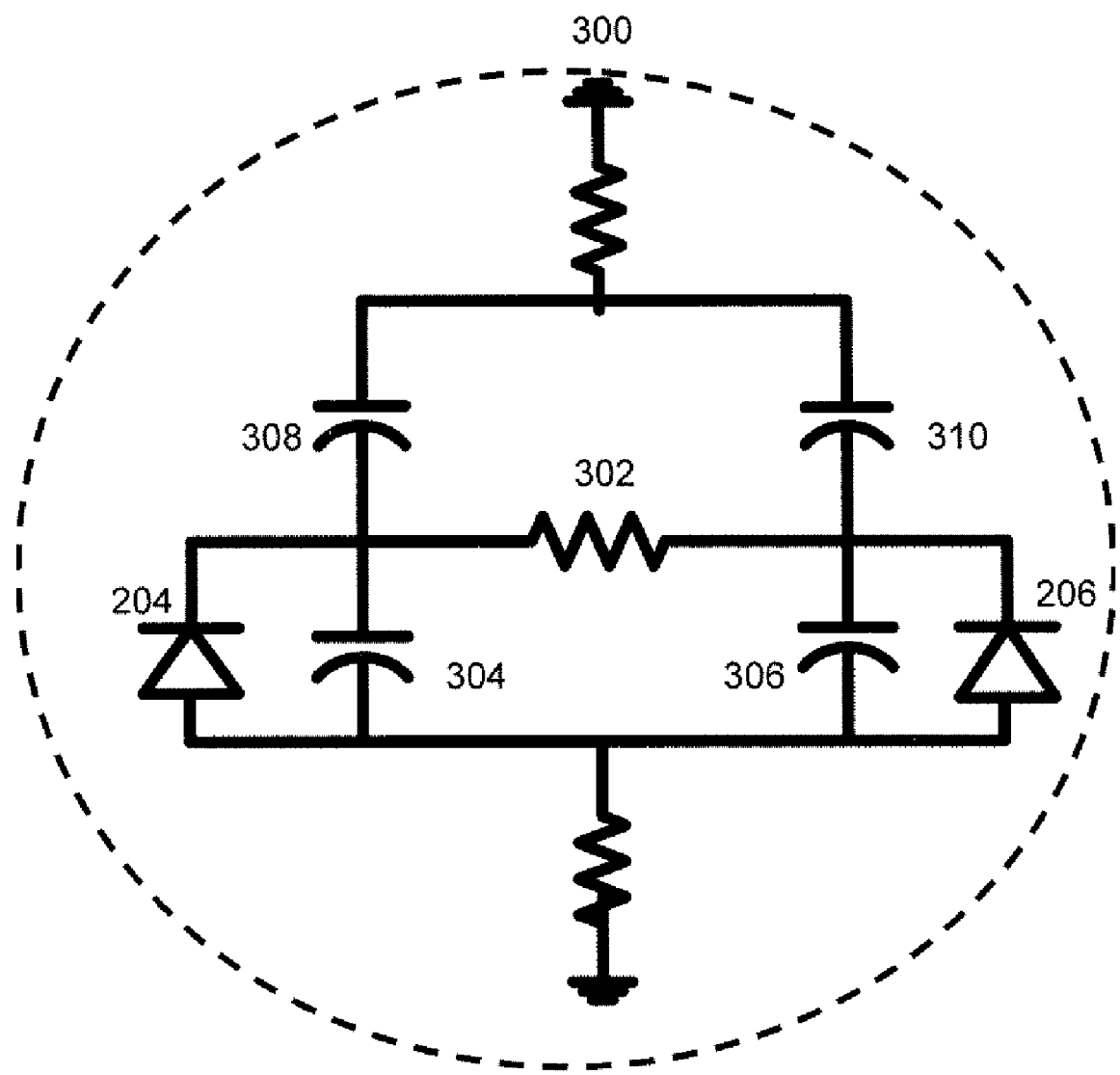
FIG. 3 illustrates an equivalent lumped model of body floating transistor at ON state, according to an example embodiment of the invention.

A CMOS RF antenna switch in accordance with an embodiment of the invention will be now be described with reference to FIGS. 1-3. It will be appreciated that while a particular embodiment of the CMOS RF antenna switch is illustrated in FIGS. 1-3, other variations of the illustrated CMOS RF antenna switch are available without departing from an embodiment of the invention.

Figure 1A:
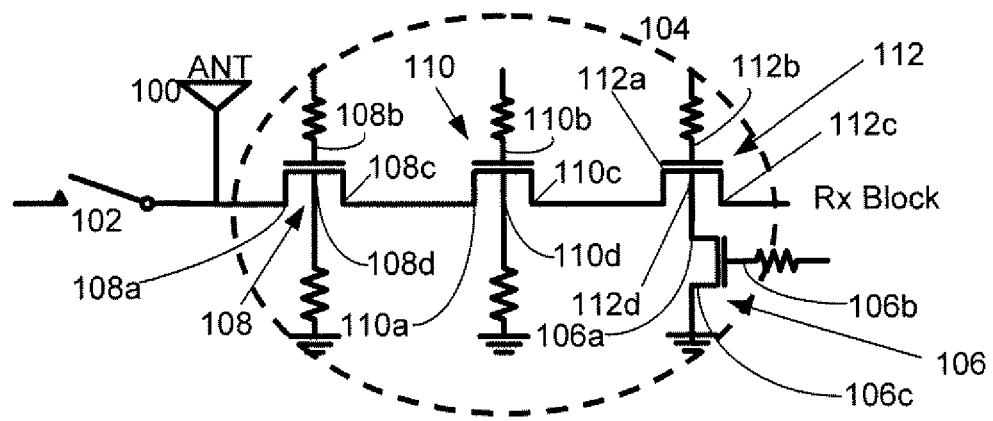
FIGS. 1A, 1B and 1C illustrate simplified example operations of a receiver switch utilizing an example body switching technique in accordance with an example embodiment of the invention.

FIG. 1A illustrates a simplified CMOS RF antenna switch and its operation in accordance with an example embodiment of the invention. The CMOS RF antenna switch may include a transmit switch 102 and a receiver switch 104, in accordance with an example embodiment of the invention. Additionally, CMOS RF antenna switch may include an antenna 100 that is in communication with at least one of the transmit switch 102 and the receiver switch 104. According to an example embodiment of the invention, the antenna 100 may be a single multi-mode (e.g., RX and TX), multi-band antenna, although a plurality of distinct antennas may be utilized according to other embodiments of the invention. The receiver switch 104 may be comprised of cascaded or stacked transistors 108, 110, 112, and 106, which may be Complementary Metal Oxide Semiconductor (CMOS) transistors, according to an example embodiment of the invention. The transistor 108 may include a source 108a, a gate 108b, a drain 108c, and a body substrate 108d. The transistor 110 may include a source 110a, a gate 110b, a drain 110c, and a body substrate 110d. The transistor 112 may include a source 112a, a gate 112b, a drain 112c, and a body substrate 112d. The transistor 106, may include a source 106a, a gate 106b, a drain 106c, and a body substrate (not shown).

The transistor 108 may have its drain 108c connected to the source 110a of transistor 110. In addition, the transistor 110 may have its drain 110c connected to the source of transistor 112a. The drain 112c of transistor 104 may be connected to the receive (RX) block to processes received signals from the antenna 100. Additionally, the body substrate 112a of the transistor 112 may be connected to the source 106a of the transistor 106. The drain 106c of the transistor 106 may be connected to ground. As will be described in further detail, at least one transistor 106, which may operate as a substrate body switch for transistor 112, may be provided at the substrate body 112d in accordance with an example body switching technique. In particular, the at least one transistor 106 may be switched to an ON state or an OFF state, depending on whether depending on whether a respective transmit (Tx) mode or receive (Rx) mode is in operation. As will be described in further detail below in accordance with an example embodiment of the invention, the receiver switch 104 of FIG. 1A may yield different equivalent circuits depending on whether the receiver switch 104 is in an OFF state, as illustrated in FIG. 1B, or an ON state, as illustrated in FIG. 1C.

A. Transmit Mode

Figure 1B:
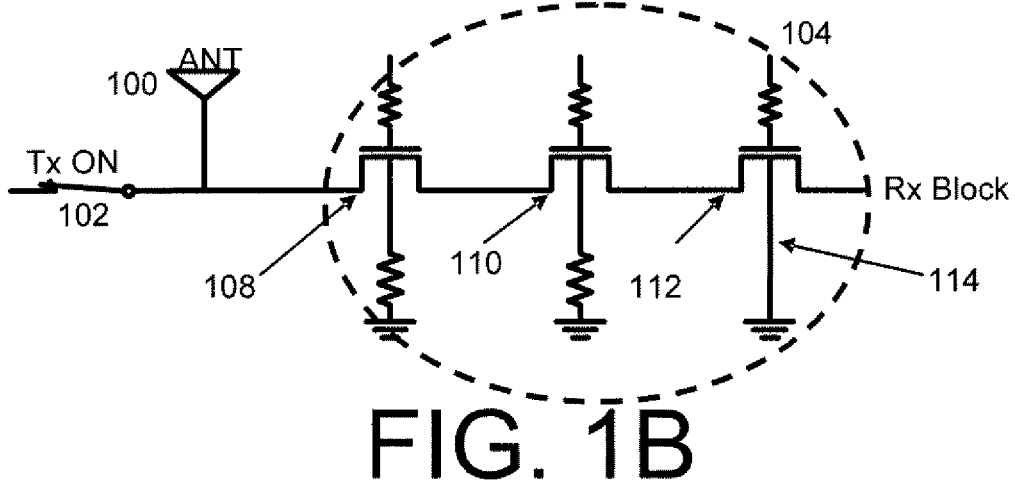
Figure 1C:
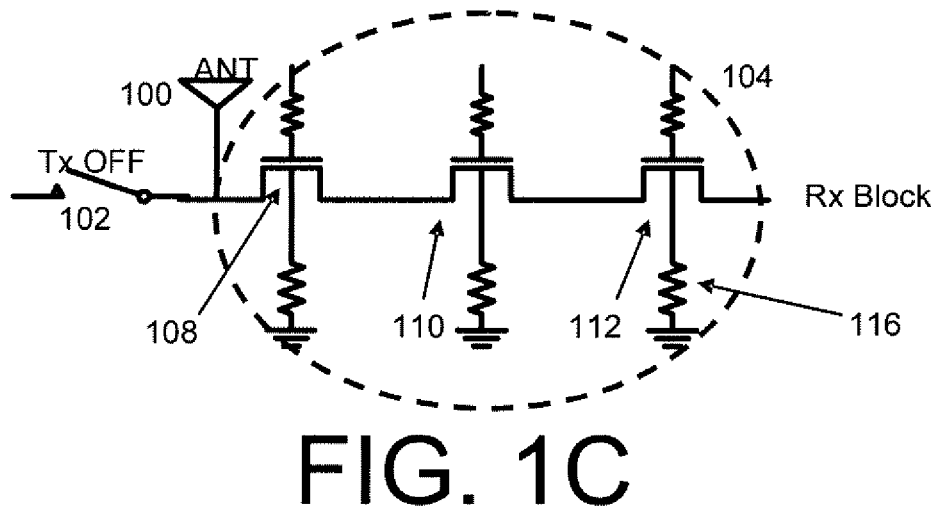

FIG. 1B illustrates an equivalent circuit of the receiver switch 104 in an OFF (e.g., disabled, block, etc.) state, according to an example embodiment of the invention. In FIG. 1B, the receiver switch 104 may be placed in the OFF state in order to provide isolation from the transmit switch 102. With the receiver switch 104 in the OFF state, a transmit signal may be provided from a transmit (Tx) block to the antenna 100. As shown in FIG. 1B, when the receiver switch 104 is in an OFF state, the stacked transistors 108, 110, 112 may then be placed in an OFF state (e.g., opened), thereby providing a higher impedance. The stacked transistor 106 may placed in an ON state 114 (e.g., closed), thereby shorting the substrate body 112d of transistor 112 to ground, and reducing the signal paths for leakage current to travel from source 112a to drain 112c.

In the configuration of FIG. 1B, the power of the transmit (Tx) signal may be maximized (and maximizing the power handling capability of the Tx block). The power handling capability of the transmit switch 102 may be determined by controlling leakage current directed towards the OFF-state receiver switch 104 as well as the source-to-drain breakdown voltage of cascaded switches 108, 110, and 112 of the receiver switch 104. Thus, the maximum transmit power of the transmit switch 102 may be dependent upon the characteristics of the receiver switch 104.

It will be appreciated that in order to increase the power handling capability of the Tx switch 102, the number of multi-stacked transistors 108, 110, 112 may be increased to reduce the breakdown burden of each transistor 108, 110, 112. For example, more than three transistors 108, 110, and 112 may be cascaded, according to another embodiment of the invention. Furthermore, it will be appreciated that the last transistor 112 from the antenna 112 can control leakage current at the receiver switch 104. If the leakage current toward OFF-state switches 108, 110, and 112 in the Rx path is minimized, then maximum power may be delivered from the Tx block to the antenna 100. As described above, the body switching transistor 106 that is connected between ground and the body substrate 112d of transistor 112 may be used to control leakage current at the receiver switch 104. More particularly, by placing the body switching transistor 106 in the ON state 114, the substrate body 112d of the last transistor 112 from the antenna 100 to the Rx block can be grounded, thereby reducing the signal paths for leakage current to travel from source 112a to drain 112c.

Still referring to FIG. 1B, when the receiver switch 104 is in the OFF position, the stacked transistors 108, 110 may be body-floating transistors while stacked transistor 112 may be a body-grounded transistor. FIG. 2A illustrates an equivalent lumped model of a body floating transistor at an OFF state 200 such as transistors 108, 110 in FIG. 1B, according to an example embodiment of the invention. FIG. 2B illustrates an equivalent lumped model of a body grounded transistor at an OFF state 202 such as transistor 112 in FIG. 1B, according to an example embodiment of the invention. The equivalent models in FIGS. 2A and 2B include capacitors 212, 214, 216, 218 as well as p-n junction diodes 204, 206, according to an example embodiment of the invention.

When a voltage swing at the antenna 100 is received by the receiver switch 104, the voltage swing may be divided among stacked transistors 108, 110, and 112. Accordingly, the last transistor 112 may only experience only one third of the full voltage swing at the antenna, thereby reducing the possibility of a source-to-drain breakdown voltage occurring for transistor 112. It will be appreciated, however, that the voltage swing at the last transistor 112 may be different, and perhaps smaller, if additional preceding transistors are provided according to other embodiments of the invention to reduce the burden of the stacked transistors 108, 110, 112.

The transistors 108, 110 may be body floating transistors, as illustrated in FIG. 2A. However, in order to reduce the leakage current towards the Rx block and maximize the power handling of the Tx block to the antenna 100, the body switching transistor 106 can be put in the ON position 114 to connect the substrate body 112d to ground. Accordingly, the transistor 112 may be a body grounded transistor, as illustrated in FIG. 2B, which reduces the signal paths for leakage current to travel from source 112a to drain 112c.

When a negative voltage swing is applied to the receiver switch 104, the p-n junction diodes 204, 206 of the transistor 112 may turn on so that leakage current may occur by the current passing through the p-n junction diodes 204, 206. An issue with the p-n junction diode 204, 206 turning on may be the possible clipping of the negative voltage swing so that power handling capability of the Tx block to the antenna 100 can be limited. However, this leakage current generated by channel formation of the device 112 in OFF state is prevented because the voltage level at 112a is fixed by the turning on voltage of the p-n junction diode 204. Indeed, the multi-stacked transistors 108, 110, and 112 at OFF-state can divide the voltage swing at antenna port so that the last OFF-state transistor 112, and thus, p-n junction diodes 204, 206, may experience only one third of voltage swing at antenna 100. Thus, the overall voltage swing at antenna port may not be sufficient to turn the p-n junction diodes 204, 206 on at the last transistor 112.

B. Receive Mode

FIG. 1C illustrates an equivalent circuit of the receiver switch 104 in an ON (e.g., enable, receive, etc.) state, according to an example embodiment of the invention. In FIG. 1C, the receiver switch 104 may be placed in the ON position in order for the receive (RX) block to receive a signal from the antenna 100. With the receiver switch 104 in the ON state, the transmit switch 102 may be placed in the OFF (e.g., disabled, block) state to isolate the transmit switch 102 from the receiver switch 104. As shown in FIG. 1C, when the receiver switch 104 is in an ON state, the stacked transistor 106 may be placed in an OFF state 116, thereby providing an equivalent resistor between the body substrate 112d of transistor 112 and ground (i.e., body floating). In this way, the insertion loss at the receive (Rx) path from the antenna 100 to the RX block may be minimized.

FIG. 3 illustrates an equivalent lumped model of body floating transistor at ON state 300, according to an example embodiment of the invention. As described above, the transistor 106 may be provided in an OFF position 116 to provide a body floating transistor, as illustrated by the equivalent lumped model of FIG. 3. In FIG. 3, as the size of the transistor 112 increases, the parasitic capacitors 304, 306, 308, 310 may provide another signal path at the ON 300 state. More specifically, the ON state transistor of FIG. 3 may have an ON-resistor 302, a gate-drain capacitor 308 to gate-source capacitor 310, and a drain-body capacitor 304, and body-source capacitor 306 as signal paths. If the body substrate were grounded, then one of these signal paths through capacitors 304, 306 may be lost, thereby increasing the insertion loss. Accordingly, when the receiver switch 104 is in the ON state, the last transistor 112 need to be in body floating state (e.g., with transistor 106 in the ON state 116) to ensure minimized insertion loss.

II. A Second Embodiment of a CMOS RF Antenna Switch

An alternative embodiment of a CMOS RF antenna switch with additional power handling capability will now be discussed with reference to FIGS. 4A-6. Generally, the CMOS RF antenna switch with improved power handling capability may include external components such as capacitors for improving the power handling of the CMOS antenna switch.

Figure 4A:
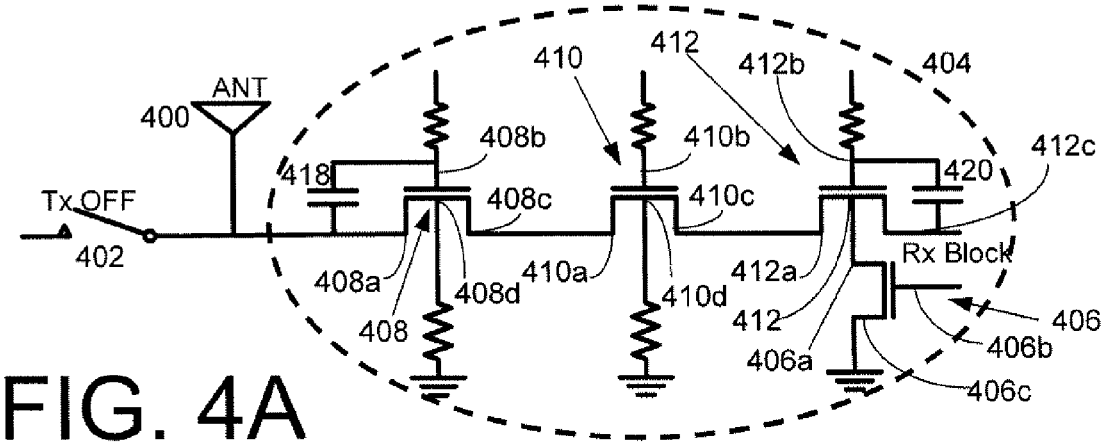
FIGS. 4A, 4B and 4C illustrate simplified example operations of a receiver switch in accordance with example embodiments of the invention.

Referring to FIG. 4A, the CMOS RF antenna switch may include a transmit switch 402 and a receiver switch 404. Further, an antenna 400 may be provided that is in communication with at least one of the transmit switch 402 and the receiver switch 404. The receiver switch 404 may include stacked transistors 408, 410, 412, and 406, which may be complementary metal oxide semiconductor (CMOS) transistors, according to an example embodiment of the invention. The receiver switch 404 may further include capacitors 418, 420. The transistor 408 may include a source 408a, a gate 408b, a drain 408c, and a body substrate 408d. The transistor 410 may include a source 410a, a gate 410b, a drain 410c, and a body substrate 410d. The transistor 412 may include a source 412a, a gate 412b, a drain 412c, and a body substrate 412d. The transistor 406 may include a source 406a, a gate 406b, a drain 406c, and a body substrate (not shown).

As shown in FIG. 4A, a external component such as a capacitor 418 may be provided between the source 408a and the gate 408b of the transistor 408. Likewise, the source 408a (or drain 408c) of the transistor 408 may be connected to its body substrate 408d. The drain 408c of transistor 408 may be connected to the source 410a of transistor 410. In addition, the source 410a (or drain 410c) of transistor 410 may be connected to its body substrate 410d. The drain 410c of transistor 410 may be connected to the source 412a of transistor 412. Another external component such as a capacitor 420 may be positioned between the gate 412b and the drain 412c of transistor 412. Further, the body substrate 412a of the transistor 412 may be connected to the source 406a of the transistor 406. The drain 406c of the transistor 406 may be connected to ground. As similarly described above, the transistor 406 may operate as a substrate body switch for transistor 412.

A. Transmit Mode

Figure 4B:
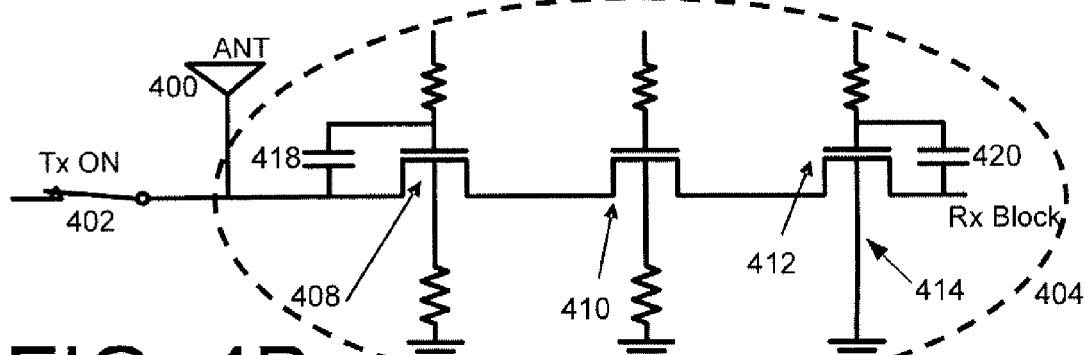

FIG. 4B illustrates an equivalent circuit of the receiver switch 404 in an OFF (e.g., disabled, block, etc) state, according to an example embodiment. In FIG. 1B, the receiver switch 404 may be placed in the OFF state in order to provide isolation from the transmit switch 402. With the receiver switch 404 in the OFF state, a transmit signal may be provided from a transmit (Tx) block to the antenna 400. As shown in FIG. 4B, when the receiver switch 404 is in an OFF state, the stacked transistors 408, 410, 412 may then be placed in an OFF state (e.g., opened), thereby providing a higher impedance. The stacked transistor 406 may placed in an ON state 414 (e.g., closed), thereby shorting the substrate body 412d of transistor 412 to ground, and reducing the signal paths for leakage current to travel from source 412a to drain 412c.

The power handling capability of the transmit switch transit switch 402 may be dependent upon the performance of the receiver switch 404 in the OFF state. The allowance of a large voltage swing at the antenna 400 port, maintenance of high impedance of OFF-state receiver switch 404, and disabling the substrate junction diodes in the receiver switch 404 for negative voltage swings may provide for high power handling capability of the CMOS antenna switch.

According to an example embodiment of the invention, large voltages swings at the antenna 400 port may be partially resolved using stacked transistors 408, 410, 412, as provided for receiver switch 404. Indeed, as similarly described above, the large voltage swings may be divided among the stacked transistors 408, 410, 412. It will be appreciated that more than three stacked transistors may be utilized without departing from embodiments of the invention. Likewise, the impedance of the OFF-state receiver switch 404 may be improved by using the body switching technique described above. More specifically, with the body switching technique, the transistor 406 may be provided in an ON state, thereby connecting the body substrate 412d of transistor 412 to ground, and reducing the signal paths for leakage current to travel from source 112a to drain 112c.

With respect to negative voltage swings experienced at the negative port, the CMOS RF antenna switch may utilize external components such as capacitors 418, 420 to reduce leakage current by preventing channel formation of a transistor (e.g., transistors 408, 412) in the OFF state. The use of these external components such as capacitors 418, 420 to reduce leakage currents in the OFF-state receiver switch 404 will now be discussed in further detail with respect to FIGS. 5 and 6.

Figure 5:
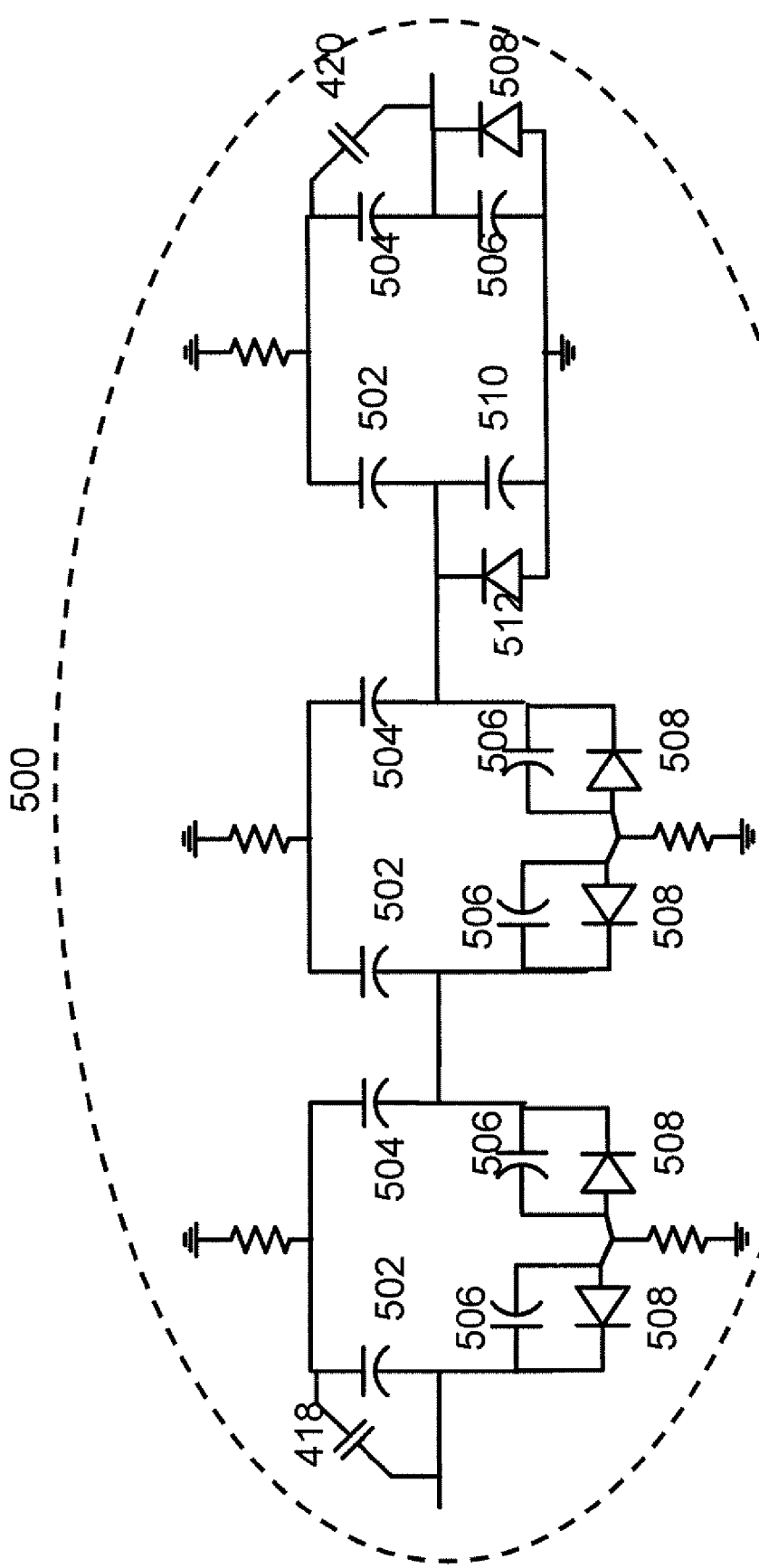
FIG. 5 illustrates an equivalent lumped model of a multi-stack structure of a receiver switch utilizing a body switching technique and external components such as capacitors, according to an example embodiment of the invention.

FIG. 5 illustrates an equivalent lumped model of a multistack structure of the receiver switch 404 of FIG. 4B, according to an example embodiment of the invention. In FIG. 5, the equivalent lumped model is provided for transistors 408, 410, 412 being in an OFF state with transistor 406 being in an ON state. As shown in FIG. 5, the equivalent lumped model for transistor 408a includes capacitors 502a, 504a, 506a, and p-n junction diode 508a. The equivalent lumped model for transistor 410 includes capacitors 502b, 504b, 506b, and p-n junction diode 508b. Likewise, the equivalent lumped model for transistor 412 includes capacitors 502c, 504c, 506c, 510, and p-n junction diodes 508, 512.

It should be appreciated that the capacitances for capacitors 502a-c, 504a-c, and 506a-c for the OFF-state transistors 408, 410, 412 may vary depending on the applied voltage swing, according to an example embodiment of the invention. Further, without the use of the external components such as capacitors 418, 412, it is possible that the OFF-state transistors 408, 410, 412 may not actually stay in the OFF state for all voltage swings at the antenna 400 port. Instead, when a high power signal is delivered from the Tx switch 402 to the antenna 400 port, the OFF-state switches transistors 408, 410, 412 may experience a large voltage swing at the antenna 400 port. In this situation, the OFF-state transistors 408, 410, 412 may turn ON, thereby causing undesirable leakage current may start to flow in the receiver switch 404. This undesirable leakage current may deteriorate the performance of the transmit signal as well as destroy the LNAs and Mixers in the receiver (Rx) block. However, as will be described in further detail below with respect to FIG. 6, the use of the external components such as capacitors 418, 420 may prevent one or more of the OFF-state transistors 408, 410, 412 from turning ON.

Figure 6:
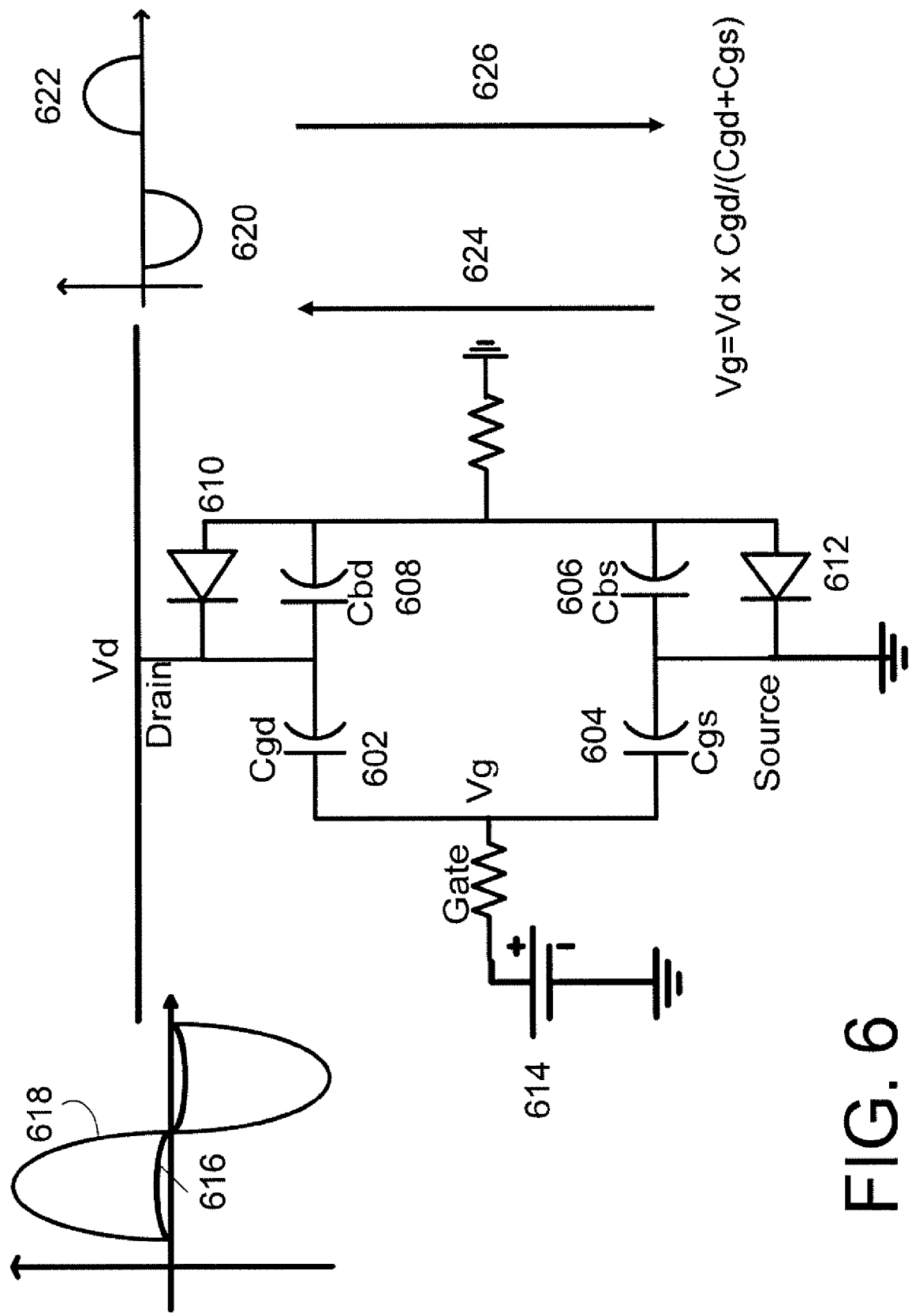
FIG. 6 illustrates a turn-on mechanism of a switch in the OFF state when a high-power signal is applied, according to an example embodiment of the invention.

FIG. 6 illustrates an equivalent circuit on an OFF-state CMOS transistor 600 such as OFF-state transistor 408, 410, according to an example embodiment of the invention. The OFF-state transistor 600 may be depicted using parasitic capacitors such as gate-drain capacitor $C_{gd}$ 602, gate-source capacitor $C_{gs}$ 604, body-source capacitor $C_{bs}$ 606 and body-drain capacitor $C_{bd}$ 608. According to an embodiment of the invention, the OFF-state CMOS transistor 600 requires a zero bias 614 for the gate, drain, and source to stay in the OFF state. When a small signal 616 voltage swing is applied to the drain, the source and drain remain at about a zero bias so that the OFF-state transistor 600 does not turn on. However, if a large signal 618 voltage swing is applied to the drain, the negative cycle 620 of the large signal 618 voltage swing may result in the drain having a lower voltage potential than the gate so that a current 624 may flow from the source to the drain. During the positive cycle 622 of the large signal 618 voltage swing, the potential of the gate may be determined based upon the capacitances of the gate-drain capacitor $C_{gd}$ 602 and the gate-source capacitor $C_{gs}$ according to $$V_g = V_d\left(\frac{C_{gd}}{C_{gd} + C_{gs}}\right).$$

With a voltage potential at the gate, a current 626 may flow from the drain to source.

In accordance with example embodiments of the invention, external components such as one or both of external capacitors 418, 420 may used to prevent undesirable currents 624, 626 during the respective negative cycle 620 and positive cycle 622 of the voltage swings. In particular, according to an embodiment of the invention, an external component such as external capacitor 420 may be connected between gate and drain such that the potential of gate is almost same as the drain so that the OFF-state transistor 600 does not turn on during the negative cycle 620 voltage swing. Likewise, an external component such as an external capacitor 418 may be connected between gate and source such that the potential of gate is almost same as the source so that OFF-state transistor 600 does not turn on during the positive cycle of voltage swing. Accordingly, by utilizing external components such as external capacitors 418, 420, the receiver switch 404 in accordance with an embodiment of the invention may resolve this conflict demand for both negative 620 and positive cycle 622 of the voltage swing in the drain from the antenna 400 port.

In summary, the receiver switch 404 in the OFF-state may include stacked transistors 408, 410, 412 for dividing the voltage burden of each transistor for large voltage swings at the antenna 400 port. Additionally, the OFF-state receiver switch 404 may utilize a body switching technique 406 for stacked transistor 412 in order to maximize the OFF-state impedance and reduce the leakage currents. Finally, the external components such as external capacitors 418, 420 may be added between either the source and gate or the drain and gate to prevent OFF-state devices of the receiver switch 404 from turning ON during a negative or positive voltage swing at the antenna 400 port.

B. Receive Mode

Figure 4C:
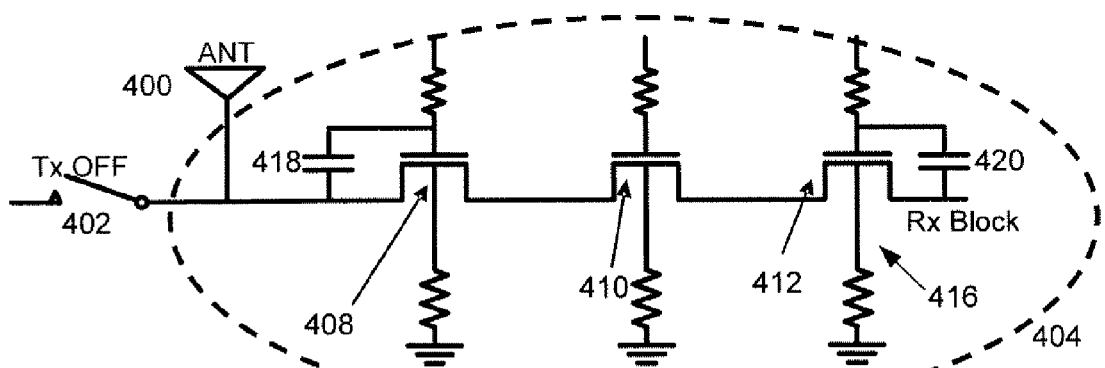

FIG. 4C illustrates an equivalent circuit of the receiver switch 404 in an OFF (e.g., disable, block, etc.) state, according to an example embodiment of the invention. In FIG. 4C, the receiver switch 404 may be placed in the ON position in order for the receive (RX) block to receive a signal from the antenna 400. With the receiver switch 404 in the ON state, the transmit switch 402 may be placed in the OFF (e.g., disabled, block) state to isolate the transmit switch 402 from the receiver switch 404. As shown in FIG. 4C, when the receiver switch 404 is in an ON state, the stacked transistor 406 may be placed in an OFF state 416, thereby providing an equivalent resistor between the body substrate 112d of transistor 412 and ground (i.e., body floating). In this way, the insertion loss at the receive (Rx) path from the antenna 400 to the RX block may be minimized.

C. Variations of Capacitances/Impedances

Figure 7:
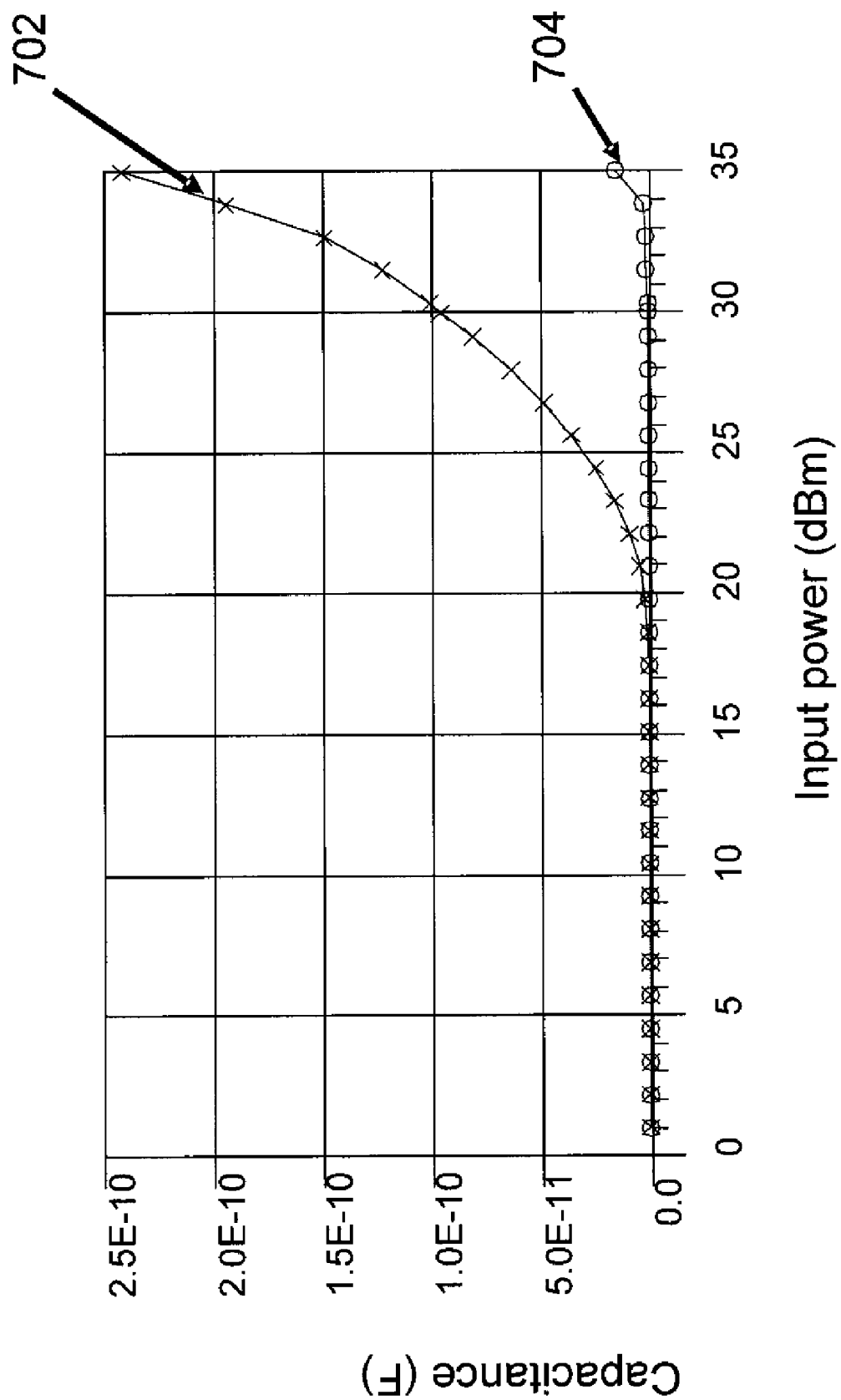
FIG. 7 illustrates an example of receiver switch simulation results in terms of capacitance of OFF state device as a function of input power level, according to an example embodiment of the invention.

FIG. 7 illustrates the variation of the overall capacitance in multi-stack structure as the input power increases in the drain port. The parasitic capacitor values (e.g., $C_{gd}$ 602, $C_{gs}$ 604, $C_{bs}$ 606 and $C_{bd}$ 608) may vary depending on whether a transistor is in ON state or OFF state. If an OFF-state transistor in a receiver switch starts to turn ON by a large voltage swing supplied to the drain, then overall capacitance value of the OFF-state transistor may increase accordingly. As shown by capacitance 702 in FIG. 7, a receiver switch that only utilizes body switching (e.g., FIG. 1B), but not external components such as capacitors 418, 420 in FIG. 4B, may result in the receiver switch having a high capacitance 702 at a high input power. The is high capacitance 702 may be indicative of OFF-state transistors in the receiver switch inadvertently turning ON. By contrast, by using body-switching and external components such as capacitors 418, 420 in accordance with FIG. 4B, a low capacitance 704 may be achieved even for a high input power. Accordingly, the low capacitance 704 at high input power means that the OFF-state transistors remain OFF even for a high input power. Accordingly, an OFF-state multi-stack receiver switch using both a body-switching technique and external components may be more stable than an OFF-state multi-stack receiver switch using only a body-switching technique.

Figure 8A:
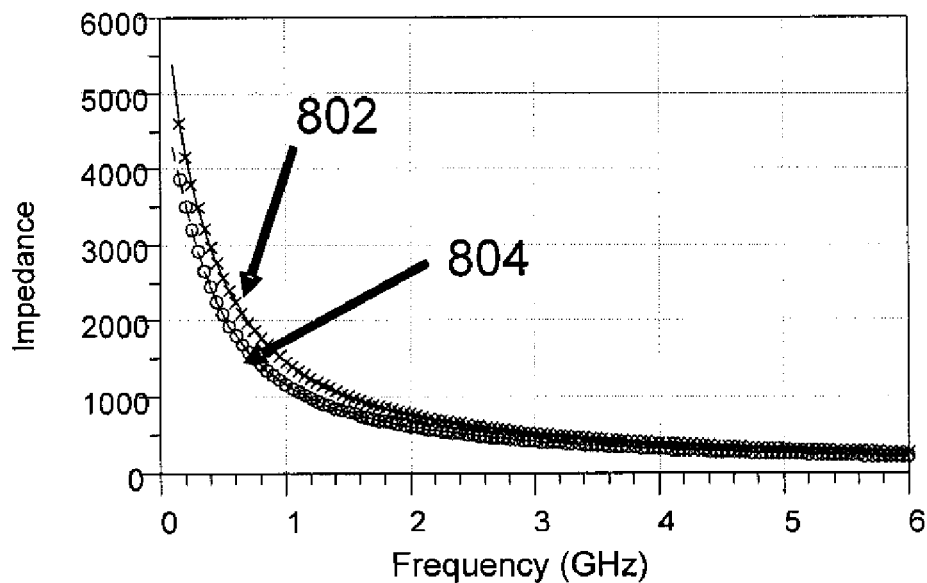
FIG. 8A illustrates an example of receiver switch simulation results in terms of impedance of OFF state device, according to an example embodiment of the invention.
Figure 8B:
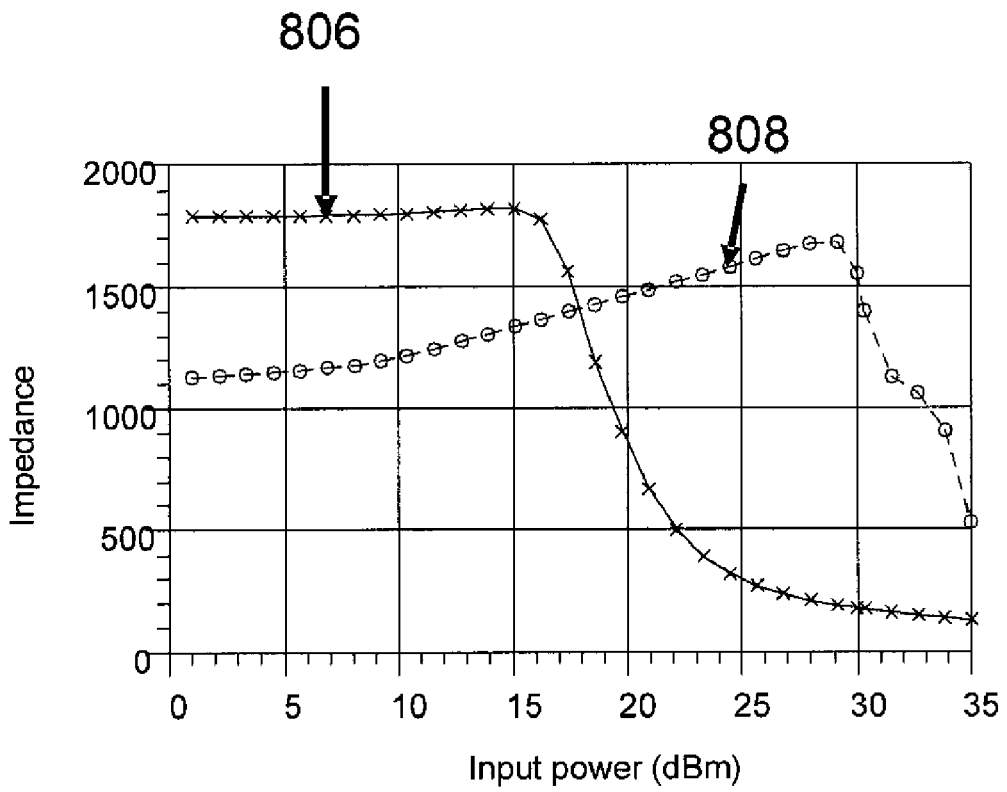
FIG. 8B illustrates an example of receiver switch simulation results in terms of impedance of OFF state device, according to an example embodiment of the invention.

FIG. 8A and FIG. 8B illustrates OFF-state impedance differences between a multi-stack receiver switch using a body-switching technique and a receiver switch using both the body-switching techniques and external components such as capacitors 418, 420. The variation of OFF-state impedance of a transistor switch of an OFF-state receiver switch may depend on the operating frequency as well as the level of input power. In particular, the operating frequency may change vary the impedance of parasitic capacitors (e.g., parasitic capacitors 602, 604, 608, 610) of the OFF-state transistor. The variation of the OFF state impedance of a receiver switch may affect power handling capability and the harmonic performance at Tx switch. FIG. 8A illustrates OFF-state impedances based upon a small signal simulation that is performed by sweeping frequencies with fixed input power. As shown in FIG. 8, for a small signal simulation, the impedance 802 for a receiver switch using only a body-switching technique may be similar to the impedance 804 for a receiver switch using both the body-switching technique. However, the OFF-state impedances may be different from for a large signal simulation that sweeps input powers at a fixed frequency. In particular, as shown in FIG. 5B, the impedance 806 of an OFF-state receiver switch using only body-switching may be lower at a higher input power than the impedance 808 of an OFF-state receiver switch using body-switching and external components. Accordingly, the receiver switch using body-switching and external components may have higher power handling capability and better harmonic performance.

III. Simulation Results

FIG. 9 illustrates simulation results for leakage currents in multi-band (e.g., 900 MHz, 1.9 GHz, 2.1 GHz) receiver switches in accordance with an example embodiment of the invention. As shown in FIG. 9, the leakage current 902 of a multi-stack receiver switch using only body-switching may be significantly higher than the leakage current 904 of a multi-stack receiver switch using both body-switching and external components.

Figure 10:
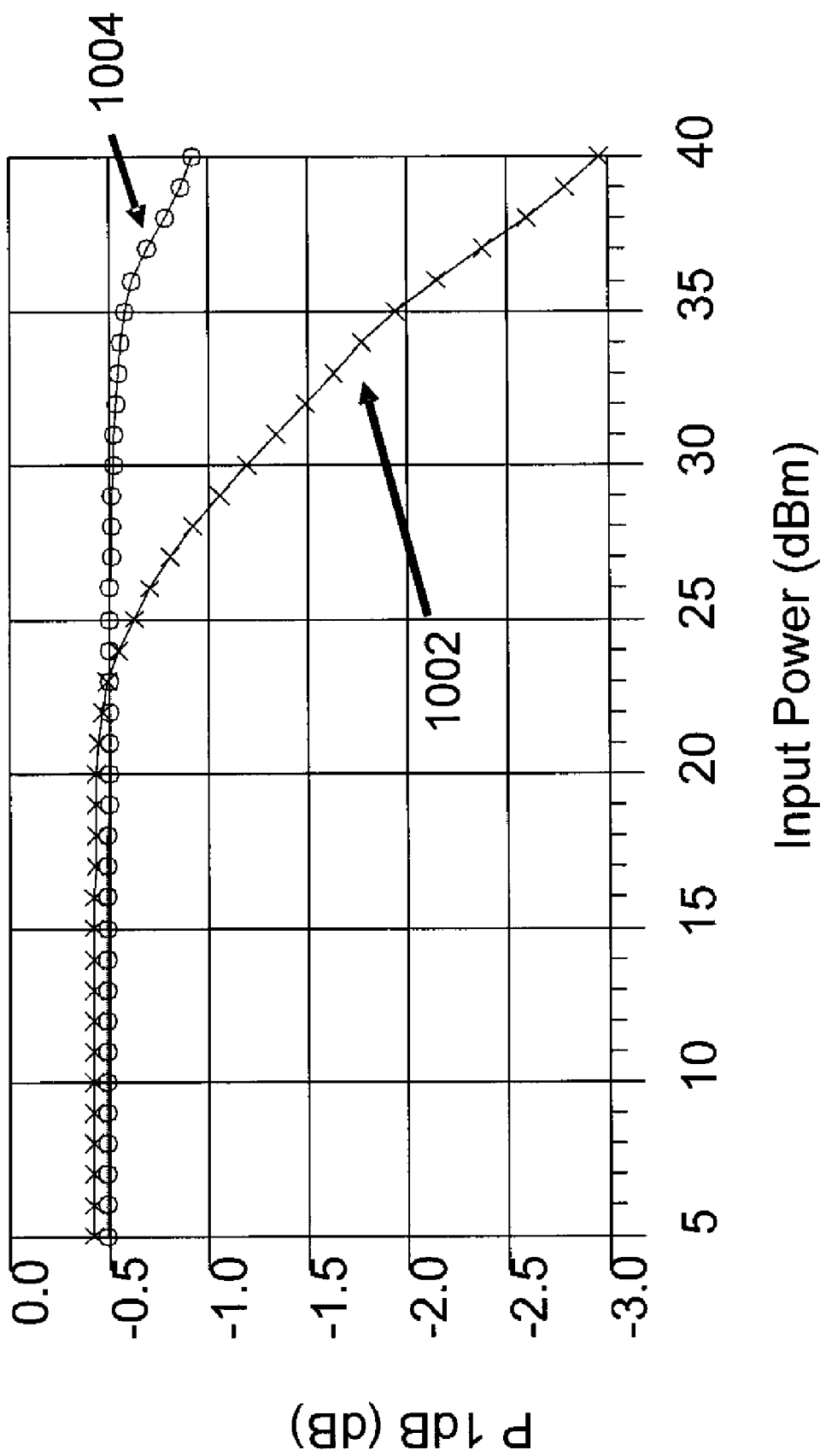
FIG. 10 illustrates an example of transmit switch simulation results in terms of power handling capability, according to an example embodiment of the invention.

FIG. 10 illustrates simulation results for power handling capabilities for the for multi-band transmit switches in accordance with an example embodiment of the invention. As shown in FIG. 10, the power handling capability 1002 for a multi-stack receiver switch using only body-switching may be significantly worse for higher input powers than then the power handling capability 1004 for a multi-stack receiver switch using both body-switching and external components.

Figure 11:
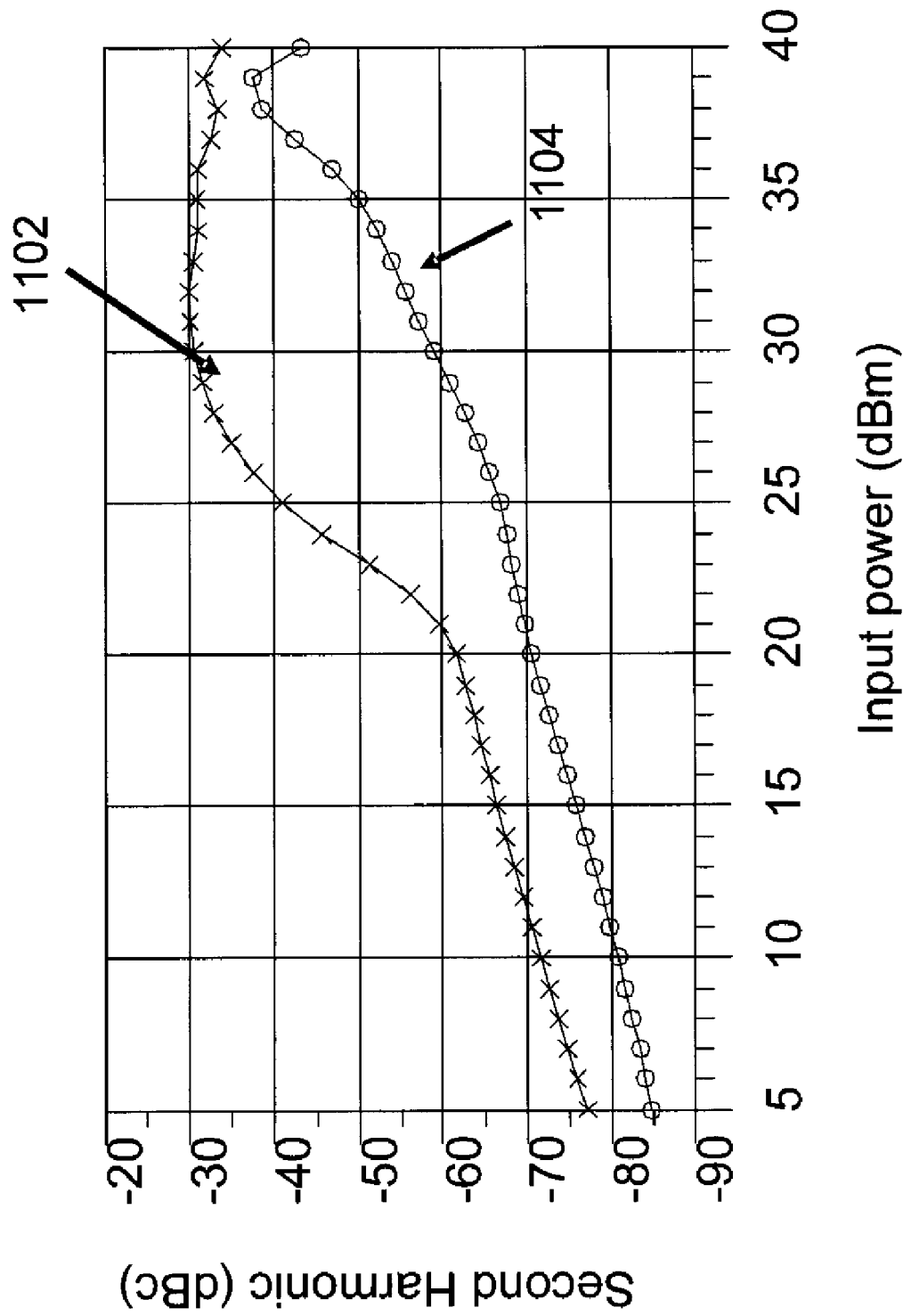
FIG. 11 illustrates an example of transmit switch simulation results in terms of second harmonic performance, according to an example embodiment of the invention.

FIG. 11 illustrates simulation results for the second harmonic performance for multi-band transmit switches in accordance with an example embodiment of the invention. As shown in FIG. 11, the second harmonic performance 1102 for a multi-stack receiver switch using only body-switching may be worse than the second harmonic performance 1104 for a multi-stack receiver switch using both body-switching and external components.

Figure 12:
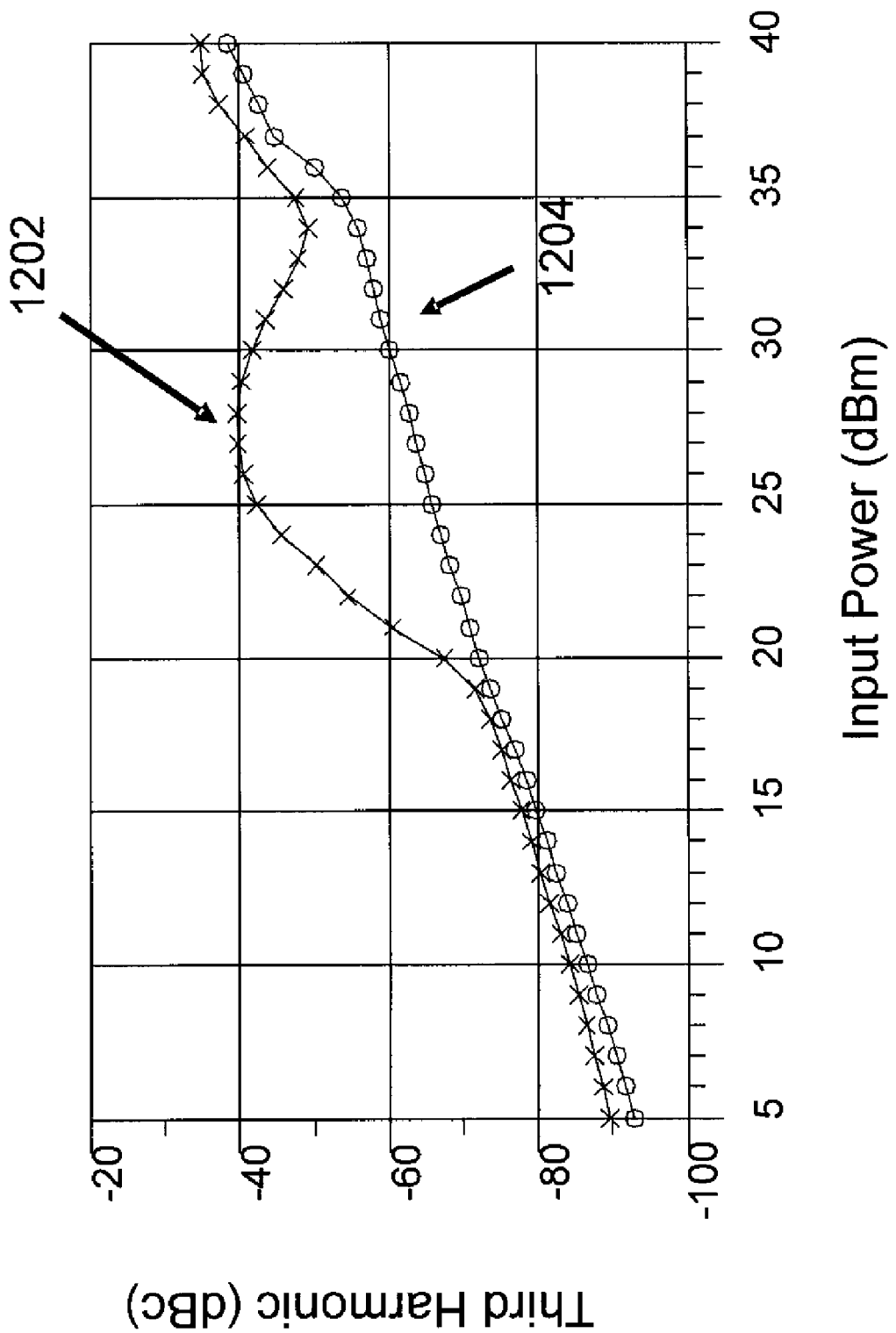
FIG. 12 illustrates an example of transmit switch simulation results in terms of third harmonic performance, according to an example embodiment of the invention.

FIG. 12 illustrates simulation results for the third harmonic performance for multi-band transmit switches in accordance with an example embodiment of the invention. As shown in FIG. 12, the third harmonic performance 1102 for a multi-stack receiver switch using only body-switching may be worse than the third harmonic performance 1104 for a multi-stack receiver switch using both body-switching and external components.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A CMOS antenna switch, comprising:
   an antenna operative at a plurality of radio frequency (RF) bands;
   a transmit switch in communication with the antenna;

a receiver switch in communication with the antenna, wherein the receiver switch comprises a plurality of transistors;

a first external component provided for a first transistor of the plurality of transistors, wherein the first transistor includes a first source and a first gate, and wherein the first external component connects the first source and the first gate; and a second external component provided for a second transistor of the plurality of transistors, wherein the second transistor includes a second gate, a second drain, and a second body substrate, wherein the second external component connects the second gate and the second drain, and wherein the second body substrate is selectively connectable between a resistance and ground.

2. The antenna switch of claim 1, wherein at least one of the first external component and the second component is a capacitor.

3. The antenna switch of claim 1, further comprising a body substrate switch for selectively connecting the second body substrate of the second transistor between a resistance and ground.

4. The antenna switch of claim 3, wherein during a transmit (Tx) mode, the transmit switch is enabled, the receiver switch is disabled, and the body substrate switch is enabled to connect the second body substrate to ground, thereby reducing leaking current toward a receiver (Rx) block associated with the receiver switch.

5. The antenna switch of claim 3, wherein the body substrate switch is operated in a first state to electrically connect the second body substrate to ground, and wherein the body substrate switch is in operated in a second state different from the first state to provide the resistance between the second body substrate and ground.

6. The antenna switch of claim 3, wherein the body substrate switch comprises a third transistor having a third source and a third drain, wherein the third source is electrically connected to the second body substrate of the second transistor and the third drain is electrically connected to ground.

7. The antenna switch of claim 3, wherein during a receive (Rx) mode, the transmit switch is disabled, the receiver switch is enabled, and the body substrate switch is disabled to provide the resistance between the second body substrate and ground.

8. The antenna switch of claim 7, wherein the second transistor includes a second source, wherein an equivalent circuit of the second transistor when the receiver switch comprises a drain-body capacitor connection and a body-source capacitor connection, and wherein while the receiver switch is enabled, at least a portion of a signal path for a receive signal from the antenna is formed by the drain-body capacitor connection and the body-source capacitor connection.

9. The antenna switch of claim 1, wherein the plurality of transistors comprise Complementary Semiconductor Oxide (CMOS) transistors that are cascaded together.

10. The antenna switch of claim 1, wherein the first transistor further includes a first drain and a first body substrate, and further comprising a third transistor having a third source, a third drain, and a third body substrate, wherein the first drain is connected to the second source and the second drain is connected to the third source.

11. A method for a CMOS antenna switch, comprising:
providing an antenna operative at a plurality of radio frequency (RF) bands;
electrically connecting a transmit switch and a receiver switch to the antenna, wherein the receiver switch comprises a plurality transistors;

providing a first external component for a first transistor of the plurality of transistors, wherein the first transistor includes a first source and a first gate, and wherein the first external component connects the first source and the first gate;

providing a second external component for a second transistor of the plurality of transistors, wherein the second transistor includes a second gate, a second drain, and a second body substrate, wherein the second external component connects the second gate and the second drain, and wherein the second body substrate is selectively connectable between a resistance and ground.

12. The method of claim 11, wherein providing the first external component and the second external component comprises providing at least one capacitor for the first external component or the second external component.

13. The method of claim 11, further comprising:
providing a body substrate switch for selectively connecting the second body substrate between the resistance and ground.

14. The method of claim 13, wherein during a transmit (Tx) mode, the transmit switch is enabled, the receiver switch is disabled, and the body substrate switch is enabled to connect the second body substrate to ground, thereby reducing leaking current toward a receiver (Rx) block associated with the receiver switch.

15. The method of claim 13, wherein the body substrate switch is operated in a first state to electrically connect the second body substrate to ground, and wherein the body substrate switch is in operated in a second state different from the first state to provide the resistance between the second body substrate and ground.

16. The method of claim 13, wherein the body substrate switch comprises a third transistor having a third source and a third drain, wherein the third source is electrically connected to the second body substrate of the second transistor and the third drain is electrically connected to ground.

17. The method of claim 13, wherein during a receive (Rx) mode, the transmit switch is disabled, the receiver switch is enabled, and the body substrate switch is disabled to provide the resistance between the second body substrate and ground.

18. The method of claim 17, wherein the second transistor includes a second source, wherein an equivalent circuit of the second transistor when the receiver switch comprises a drain-body capacitor connection and a body-source capacitor connection, and wherein while the receiver switch is enabled, at least a portion of a signal path for a receive signal from the antenna is formed by the drain-body capacitor connection and the body-source capacitor connection.

19. The method of claim 11, wherein the plurality of transistors comprise Complementary Semiconductor Oxide (CMOS) transistors that are cascaded together.

20. The method of claim 11, wherein the first transistor further includes a first drain and a first body substrate, and further comprising a third transistor having a third source, a third drain, and a third body substrate, wherein the first drain is connected to the second source and the second drain is connected to the third source.

21. A CMOS antenna switch, comprising:
an antenna operative at a plurality of radio frequency (RF) bands;
a transmit switch in communication with the antenna;
a receiver switch in communication with the antenna, wherein receiver switch comprises a plurality of transistors, including a first transistor having a first source and a first gate, and a second transistor having a second gate, a second drain, and a second body substrate;

means for electrically connecting the first source and the first gate;
means for electrically connecting the second gate and the second drain;
means for selectively connecting the second body substrate between a resistance and ground.

* * * * *